United States Patent

Jones et al.

[11] Patent Number: 5,537,829
[45] Date of Patent: Jul. 23, 1996

[54] CRYOSTAT ASSEMBLY

[75] Inventors: Francis J. Jones, Witney; Peter D. Daniels, Daventry, both of United Kingdom

[73] Assignee: Oxford Instruments, Ltd., Oxford, United Kingdom

[21] Appl. No.: 360,827

[22] PCT Filed: Mar. 16, 1994

[86] PCT No.: PCT/GB94/00523

§ 371 Date: Nov. 23, 1994

§ 102(e) Date: Nov. 23, 1994

[87] PCT Pub. No.: WO94/21956

PCT Pub. Date: Sep. 29, 1994

[30] Foreign Application Priority Data

Mar. 25, 1993 [GB] United Kingdom .................... 9306166

[51] Int. Cl.$^6$ .................................................. F25B 19/00
[52] U.S. Cl. ............................................ 62/51.1; 335/300
[58] Field of Search ...................... 62/51.1, 45.1; 335/300

[56] References Cited

U.S. PATENT DOCUMENTS

| 2,863,297 | 12/1958 | Johnston | 62/45.1 |
| 3,782,128 | 1/1974 | Hampton et al. | 62/45.1 |
| 4,038,832 | 8/1977 | Lutgen et al. | 62/45.1 |
| 4,721,934 | 1/1988 | Stacy | 335/300 |
| 4,976,110 | 12/1990 | Reid | 62/45.1 |

FOREIGN PATENT DOCUMENTS

| 1190831 | 10/1959 | France . |
| 1814783 | 7/1970 | Germany . |
| 4020593A1 | 1/1991 | Germany . |
| 5178378 | 7/1993 | Japan . |

Primary Examiner—Ronald C. Capossela

[57] ABSTRACT

A cryostat assembly having an outer vessel within which is provided substantially upright inner vessel for containing an item, such as an electromagnet, to be cooled. The inner vessel is suspended from the outer vessel by a number of low thermal conductivity support members secured at one end to points on the outer vessel corresponding to the height of the center of gravity of the assembly and an item in use and at the other end to the inner vessel at points not higher than the said points on the outer vessel.

15 Claims, 1 Drawing Sheet

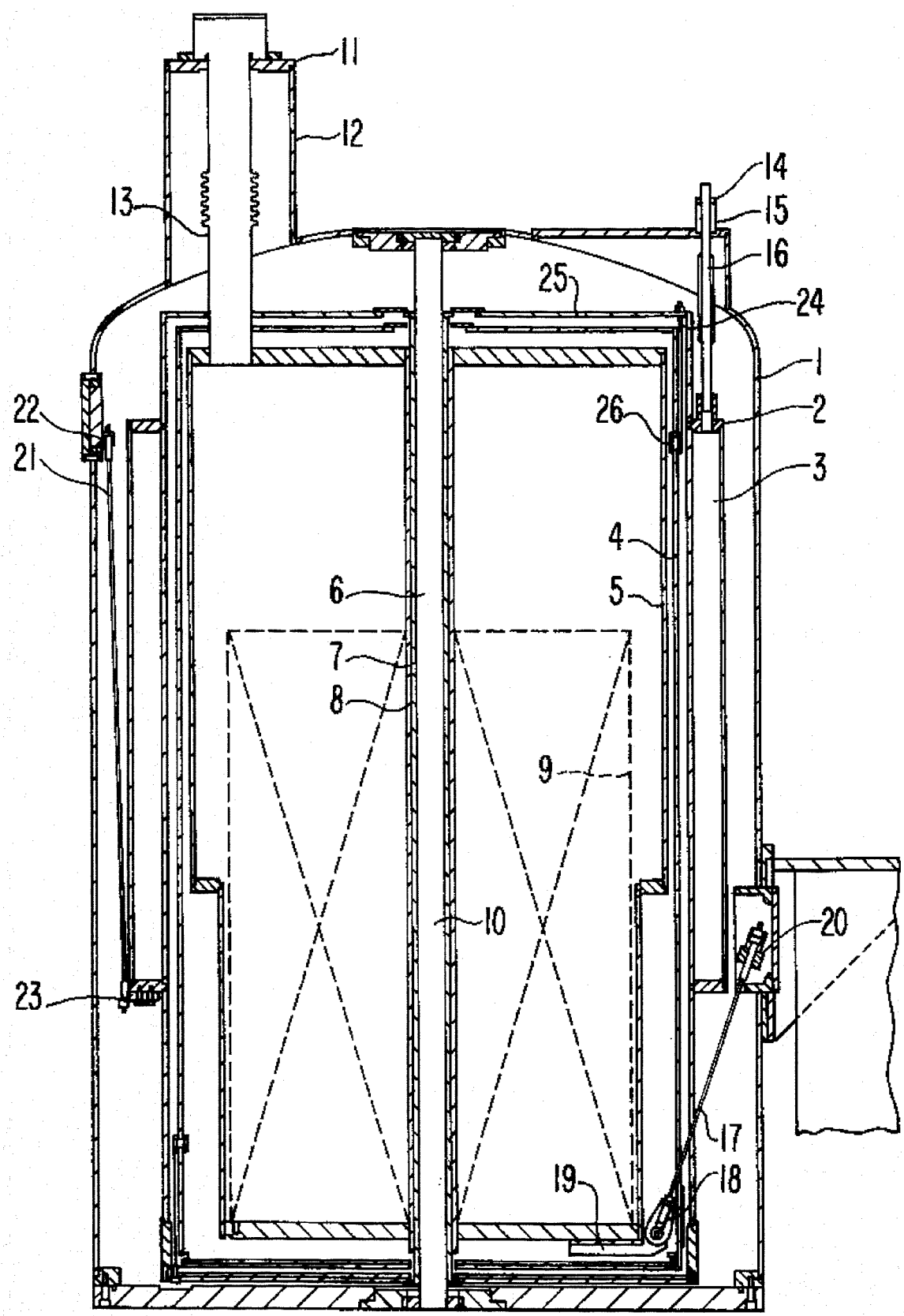

CRYOSTAT ASSEMBLY

BACKGROUND OF THE INVENTION

1. Field of the Invention

The invention relates to a cryostat assembly.

2. Description of the Related Art

Cryostat assemblies are used in a variety of fields to provide a cooled region within which is positioned an instrument such as a detector or a magnet particularly where it is desired to provide a superconducting magnet.

One of the problems with conventional cryostats is that they are susceptible to low frequency vibrations which, in the case of, for example, a spectrometer, can lead to deterioration in the accuracy of the results which are obtained. The reason for the deterioration is that the time varying perturbation of the magnetic field on the nuclear magnetic resonance (NMR) or ion cyclotron resonance (ICR) sample which results from the vibrations will lead to undesirable artifacts in the measurements made.

SUMMARY OF THE INVENTION

In accordance with the present invention, a cryostat assembly comprises an outer vessel within which is provided an inner vessel for containing an item to be cooled, the inner vessel being suspended from the outer vessel by a number of low thermal conductivity support members secured at one end to points on the outer vessel substantially at the height of the centre of gravity of the system constituted by the assembly and item in use and at the other end to the inner vessel at points not higher than the said points on the outer vessel.

We have realised that conventional assemblies arrange for the various vessels to be supported towards the top from the outer, usually vacuum, vessel leading to a "pendulum" effect in response to low vibration input. In contrast, the invention arranges for the inner vessel to be suspended from the outer vessel from points between the ends of the outer vessel, typically substantially mid-way along the outer vessel substantially in line with the centre of gravity of the system. A modal analysis of an assembly constructed according to the invention has shown that the lowest modal frequencies are significantly higher with the invention than those obtained with conventional assemblies.

In practice, the one ends of the support members do not need to exactly align with the centre of gravity of the system, and for example the one ends of the support members may be secured to the outer vessel at points situated within 10% of the overall height of the assembly above or below a horizontal plane containing the centre of gravity.

Typically, the other ends of the support members will be connected to the base of the inner vessel but in principle other secure points are possible. In general, the fixing point to the vessel should, as far as vibration reduction is concerned, be strong, therefore the corner of the vessel, or a rigidly supported part of it, would be best. Since the base of a typical Helium vessel is thick, this would be a good point of attachment.

In some cases, the cryostat assembly may comprise just the outer vessel and the inner vessel. Normally, however, additional vessels and/or thermal shields are provided. In the preferred arrangement, the inner vessel comprises a first coolant containing vessel, the assembly further comprising a second coolant containing vessel surrounding the first and suspended from the outer vessel, and optionally a thermal shield surrounding the first coolant vessel and suspended from the second coolant vessel.

In the case where the assembly is to be used to cool a superconducting magnet, the magnet will be placed in the inner vessel with the first coolant typically being liquid Helium, while the second coolant is liquid nitrogen.

Typically, there will be three substantially equally angularly spaced support members suspending the inner vessel from the outer vessel. The ends of the support members attached to the outer vacuum vessel maybe attached via a continuous ring or by individual mounting arrangements.

The term "low conductivity" is well understood in the art, a typical example being 170 watts/meter.

The support members could comprise glass fibre reinforced epoxy resin rods but in the preferred arrangement comprise Kevlar reinforced epoxy resin rods. The modulus of elasticity of this material is higher giving a stiffer suspension system, raising the resonance frequencies and reducing the magnet displacements.

Although magnet displacements are smaller at higher frequencies, and therefore higher frequency vibrations are less of a problem as regards this, it is possible to get resonance artefacts in the spectrometer results which are in the higher frequency range. It would be possible to support the cryostat assembly on an anti-vibration mounting which prevents frequencies higher than the lowest modal frequency from being communicated to the cryostat assembly. In this way the assembly could be completely isolated from the effects of vibration.

Cryostat assemblies according to the invention can be used, for example, to house magnets for use in nuclear magnetic resonance applications and ion cyclotron resonance applications.

BRIEF DESCRIPTION OF THE DRAWINGS

An example of a cryostat assembly according to the invention for use in an NMR spectrometer will now be described with reference to the accompanying drawing of which:

FIG. 1 is a longitudinal cross-sectional diagram of a cryostat assembly in accordance with the preferred embodiment.

DESCRIPTION OF THE PREFERRED EMBODIMENTS

Reference will now be made in detail to the present preferred embodiments of the present invention, examples of which are illustrated in the accompanying drawings, wherein like reference numerals refer to like elements throughout.

The assembly comprises an outer vacuum vessel 1 having a tubular form with a domed top portion and defining an internal volume which is evacuated in use. Nested within the outer vacuum vessel 1 are a liquid nitrogen vessel 2 having liquid nitrogen containing portion 3, a thermal shield 4, and a liquid helium vessel 5 which contains liquid helium. Each of the vessels 2,5 and the thermal shield 4 is tubular. The outer vacuum vessel 1, and the vessels 2,5 each have a vertically oriented bore defined by a respective tube 6,7,8.

An electromagnet 9 is mounted within the helium vessel 5 about the tube 8 and will generate a high strength magnetic field having a homogeneous, working region centred at an origin 10 within the tube 6.

The cryostat has a neck section 11 at the top, of generally conventional form, including an outer section 12 communicating with the outer vacuum vessel 1, and an inner section 13 to enable the liquid helium to be supplied to the liquid helium vessel 5. The cryostat has a further neck section 14 including an outer section 15 communicating with the outer vacuum vessel 1, and an inner section 16 to enable the liquid nitrogen to be supplied to the nitrogen vessel 3.

Conventionally, the liquid nitrogen vessel, liquid helium vessel and the thermal shield are all suspended from the domed portion of the vacuum vessel. In the present case, however, the inner, liquid helium vessel 5 is suspended from the outer vacuum vessel 1 by a set of three Kevlar rods 17 (only one visible in the drawing) which are secured at one end 18 to a bracket 19 mounted to the base of the liquid helium vessel 5, pass through apertures in the thermal shield 4 and liquid nitrogen vessel 2 and are anchored at their other end 20 to the outer vacuum vessel 1. The position of the anchorage 20 is chosen to be substantially in a plane orthogonal to the vertical axis and containing the centre of gravity of the magnet and cryostat. Variations from this position within about 10% of the height of the cryostat are possible without seriously affecting the resonant frequencies.

The liquid nitrogen vessel 2 is suspended from the outer vacuum vessel 1 by a set of three substantially equally angularly spaced rods 21 (only one shown in the drawing) extending from an upper end of the outer vacuum vessel 1 at a mounting 22 to a bracket 23 connected to the liquid nitrogen vessel.

The thermal shield 4 is suspended from the liquid nitrogen vessel by a set of three substantially equally angularly spaced support rods 24 (only one shown in the drawing) extending from an upper surface 25 of the liquid nitrogen vessel to a bracket 26 on the thermal shield.

In order to see the improvement in modal frequency response which is achieved using the cryostat assembly shown in the drawing as compared with the conventional cryostat assembly in which all the vessels and shields are supported from the dome portion of the outer vacuum vessel, a finite element analysis has been carried out on the conventional and the new assemblies of similar size and specification. The modal frequencies obtained are set out in the table below.

TABLE

| MODE | MODAL FREQUENCIES (Hz) | |
|---|---|---|
| | CONVENTIONAL | NEW |
| 1 | 1.54 | 15.36 |
| 2 | 1.54 | 17.44 |
| 3 | 2.58 | 30.3 |
| 4 | 4.01 | 30.6 |
| 5 | 4.15 | 35.2 |
| 6 | 4.12 | 42.9 |
| 7 | 5.97 | 44.6 |
| 8 | 7.89 | 44.6 |
| 9 | 15.13 | 44.6 |
| 10 | 18.03 | 44.6 |
| 11 | 25.70 | 44.6 |
| 12 | 29.81 | 47.9 |
| 13 | 34.17 | 47.9 |
| 14 | 34.92 | 50.0 |

It can be seen from the Table that the lowest modal frequencies of the new assembly are considerably higher than those of the conventional assembly and this leads to a far more stable cryostat which is not susceptible to external, low frequency vibrations and thus reduces the occurrence of undesirable artifacts in the NMR (or ICR) measurements, in comparison with the measurements obtained using a conventional assembly.

We claim:

1. A cryostat assembly comprising an outer vessel within which is provided an inner vessel for containing an item to be cooled, the inner vessel having a substantially uprightly oriented bore, the inner vessel being suspended from the outer vessel by a number of low thermal conductivity support members having first and second ends, the first ends of said support members being secured to points on the outer vessel substantially at a height corresponding to a center of gravity of the the assembly and an item in use and at the second ends of the support members being secured to the inner vessel at points not higher than the said points on the outer vessel.

2. An assembly according to claim 1, wherein the first ends of said support members are secured to the outer vessel at points situated within 10% of the overall height of the assembly above or below a horizontal plane containing the center of gravity.

3. An assembly according to claim 1, wherein the first ends of said support members are positioned substantially in the same horizontal plane.

4. An assembly according to claim 1, wherein three support members are provided at locations substantially equally angularly spaced around the outer vessel.

5. An assembly according to claim 1, wherein the support members comprise Kevlar reinforced, epoxy resin rods.

6. An assembly according to claim 1, wherein the outer vessel is evaluated in use, and the inner vessel comprises a liquid coolant containing vessel.

7. An assembly according to claim 6, further comprising a second coolant containing vessel surrounding the inner vessel, and a thermal shield surrounding the second coolant containing vessel.

8. An assembly according to claim 7, wherein the inner coolant containing vessel contains liquid helium, and the second coolant containing vessel contains liquid nitrogen.

9. An assembly according to claim 1, further comprising an electromagnet situated in the inner vessel.

10. An assembly according to claim 1, wherein said inner vessel is suspended from the outer vessel solely by said support members, each of said support members being in tension.

11. An assembly according to claim 1, wherein said outer vessel has an uprightly oriented bore.

12. An NMR spectrometer having a cryostat assembly comprising an outer vessel within which is provided an inner vessel for containing an item to be cooled, the inner vessel having a substantially uprightly oriented bore, the inner vessel being suspended from the outer vessel by a number of low thermal conductivity support members having first and second ends, the first ends of said support being secured to points on the outer vessel substantially at a height corresponding to a center of gravity of the assembly and an item in use and at the second ends of said support members being secured to the inner vessel at points not higher than the said points on the outer vessel.

13. An NMR spectrometer according to claim 12 further comprising an electromagnet situated in said inner vessel.

14. An NMR spectrometer according to claim 12 wherein said outer vessel has an uprightly oriented bore.

15. An ion cyclotron resonance device having a cryostat assembly comprising an outer vessel within which is provided an inner vessel for containing an item to be cooled, the inner vessel having a substantially uprightly oriented bore, the inner vessel being suspended from the outer vessel by a number of low thermal conductivity support members having first and second ends, the first ends of said support members being secured to points on the outer vessel substantially at a height corresponding to a center of gravity of the assembly and an item in use and at the second ends of said support members being secured to the inner vessel at points not higher than the said points on the outer vessel.

* * * * *